United States Patent [19]

Butler

[11] Patent Number: 5,513,139

[45] Date of Patent: Apr. 30, 1996

[54] RANDOM ACCESS MEMORY WITH CIRCUITRY FOR CONCURRENTLY AND SEQUENTIALLY WRITING-IN AND READING-OUT DATA AT DIFFERENT RATES

[75] Inventor: Donald S. Butler, Scottsdale, Ariz.

[73] Assignee: General Instruments Corp., Hatboro, Pa.

[21] Appl. No.: 334,598

[22] Filed: Nov. 4, 1994

[51] Int. Cl.$^6$ .................................................. G11C 7/00
[52] U.S. Cl. .............. 365/189.04; 365/221; 365/230.05; 365/230.06; 365/239; 365/233
[58] Field of Search .............................. 365/189.04, 221, 365/230.05, 230.06, 239, 149, 154, 233; 371/43

[56] References Cited

U.S. PATENT DOCUMENTS

| | | | |
|---|---|---|---|
| 4,777,636 | 10/1988 | Yamashita et al. | 371/43 |
| 5,255,220 | 10/1993 | Filliman | 365/189.04 |
| 5,265,049 | 11/1993 | Takasugi | 365/189.01 |

Primary Examiner—David C. Nelms
Assistant Examiner—Andrew Q. Tran
Attorney, Agent, or Firm—Henry I. Schanzer

[57] ABSTRACT

A memory system includes a memory array of cells arranged in "r" rows and "c" columns, with each row of cells connected to a write conductor and to a separate read conductor. The memory array may be simultaneously written into and read from by a write address decoder having "r" outputs, one output connected to and corresponding to each write conductor and a read address decoder having "r" outputs, one output connected to and corresponding to each read conductor. Control signals are applied to the write address decoder to cause the outputs of the write address decoder to scan the memory array at a first rate, in sequence, in a first direction, and control signals are applied to the read address decoder to cause the outputs of the read address decoder to scan the memory array at a second rate, in sequence, in a second direction, opposite the first direction. The first and second rates and the number of rows of the memory array are selected such that no memory location is written into and read from during the same time interval, preventing interference between the read and write functions.

11 Claims, 7 Drawing Sheets

RANDOM ACCESS MEMORY WITH CIRCUITRY FOR CONCURRENTLY AND SEQUENTIALLY WRITING-IN AND READING-OUT DATA AT DIFFERENT RATES

BACKGROUND OF THE INVENTION

This invention relates to a memory system and, in particular, to a memory system in which "new" bits of information can be written into a memory array and from which "old" (i.e., previously written) bits of information can be read out at the same time, without interference between the read and the write functions.

A need exists for a memory system (also referred to as a "path" memory) having a memory array into which a stream of data bits can be written into sequential locations, at great speed. However, the data being loaded into the memory may not be absolutely accurate due to some form of transmission noise. To handle the problem associated with the receipt and storage of inaccurate data, a Viterbi algorithm was developed. After a number of data bits have been written in sequence into the memory, as in 20/20 hindsight, the algorithm "replays" the received data in reverse sequence (e.g., backwards) to see if the chosen state change at each time step was optimum. Thus, for example, after information has been sequentially written and stored in 2N locations of a path memory at a predetermined data rate, the data stored in the memory must be read out, in reverse order, from these 2N locations at twice the data rate. At the same time another N locations must be filled with incoming data at the normal data rate since it is assumed that data is being continuously received. As each new group of N data bits are received and stored in N bit locations (path points), the path memory stores the "new" group of data bits while also enabling the previous 2N data bits (points) to be reviewed in reverse order to the order in which they were received and stored.

Figure 1:
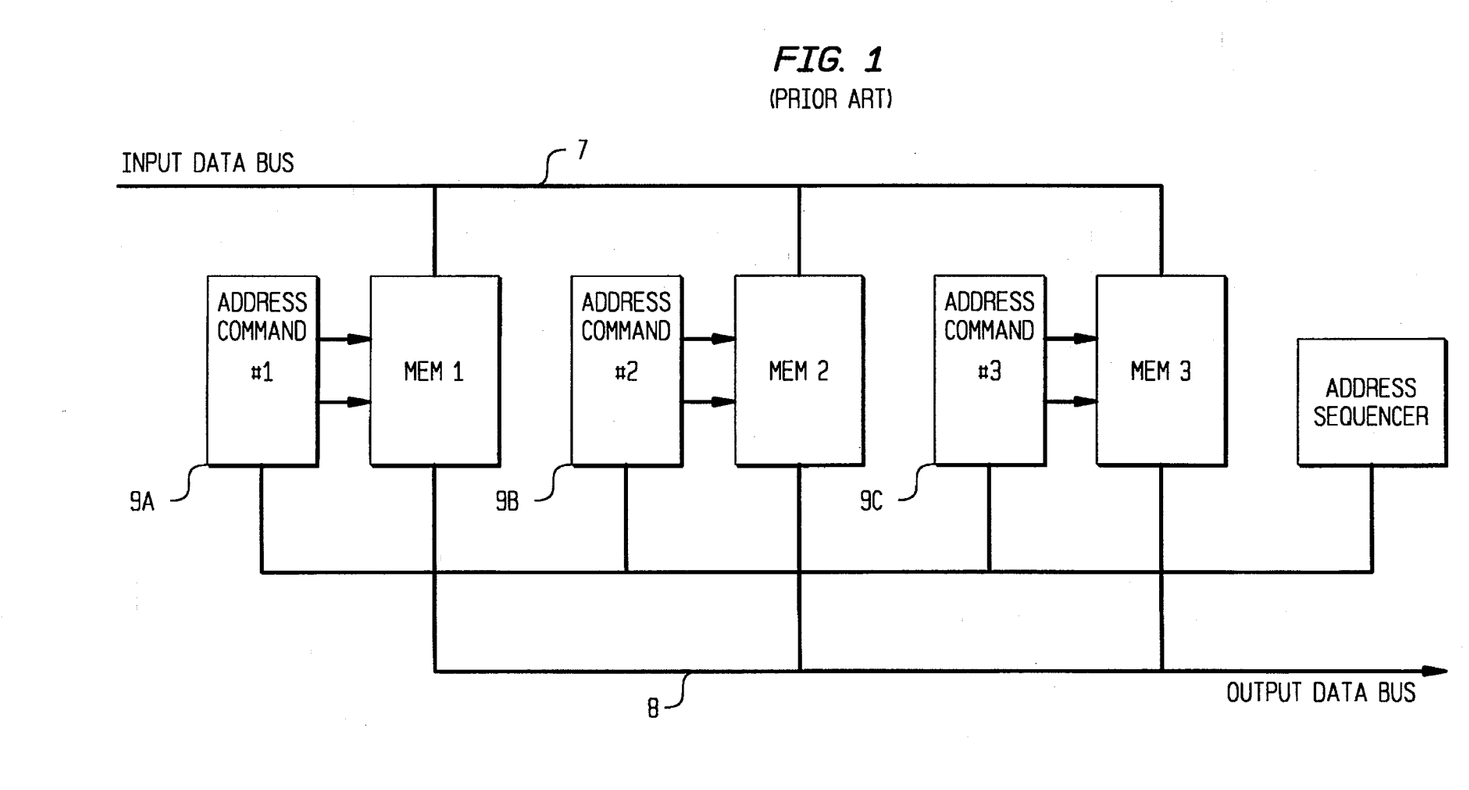
FIG. 1 is a block diagram of a prior art memory system.

A prior art memory system configured to perform the function of accepting "new" data and concurrently reading out, in reverse order, previously received data is shown in block diagram form in FIG. 1. In FIG. 1, the memory system is implemented with three individual memories or memory blocks (MEM 1, MEM 2, MEM 3). Each one of the memory blocks MEM 1, MEM 2 and MEM 3 is coupled to an input data bus, 7, and to an output data bus, 8, and each memory has its own address decoder, 9a, 9b, and 9c.

The function of writing information into the memory system and concurrently reading information from the system is implemented using three memory blocks because the address order and data sample rates are different in the Read and Write cycles. Each memory block is used in a different manner during each of three overall "PHASES". During any one of the three PHASES, one of the three memories is in a Write mode while the other two memories are in a Read-out mode. At the end of each PHASE the read or write function of the memory blocks changes.

For example, in a first PHASE (PHASE 1), Memory 1 is written with N path identifiers at a frequency of Fs in address ascending order while Memory 3 and then Memory 2 are read out at a frequency of 2 Fs in descending order starting at the top of Memory 3. Subsequently, the phase increments to a second phase (PHASE 2) where the incoming data is written into Memory 2 in ascending order while Memory 1 and Memory 3 are read in descending order starting at the top of Memory 1. After that, in the third phase (PHASE 3), Memory 3 is written in ascending order while Memory 2 and Memory 1 are read in descending order starting at the top of MEMORY 2. The memories are then repeatedly cycled through the sequence just outlined.

A sequence of writing and reading the memory system, in accordance with the prior art would be essentially as outlined below:

PHASE I—Write MEM1 and Read Out MEM3 and then Read Out MEM2;

PHASE II—Write MEM2 and Read out MEM1 and then MEM3; and

PHASE III—Write MEM3 and Read MEM2 and then MEM1.

Evidently, the prior art memory structure requires considerable logic for switching the memories, sequencing the memory addresses in both directions (count up and down) and switching addressing rates between read and write modes.

An object of the present invention is to produce the required read-write memory function using a simpler and more integrated structure.

SUMMARY OF THE INVENTION

A memory system embodying the invention includes a memory array of cells arranged in "r" rows and "c" columns with each row of cells being connected to a write conductor and to a separate read conductor. Information is written into selected locations of the memory array by means of a write address decoder having "r" outputs, one output connected to, and corresponding to, each write conductor of the memory array. Information stored in the memory array is read-out from selected locations of the memory array by means of a read address decoder having "r" outputs, one output connected to, and corresponding to, each read conductor of the memory array.

In a preferred embodiment control signals are applied to the write address decoder and to the read address decoder for: (a) generating enabling signals at the outputs of the write address decoder for sequentially energizing the outputs of the write address decoder and their corresponding write conductors in an ordered sequence having a first direction (e.g., ascending from row 1 to row "r") at a sampling rate of Fs; and (b) for generating enabling signals at the outputs of the read address decoder for sequentially energizing the outputs of the read address decoder and their corresponding read conductors in an ordered sequence having a second direction, opposite said first direction, (e.g., descending order from the rth row to the first row) at a sampling rate of nFs; where n is an integer equal to, or greater than 2.

The memory system embodying the invention enables information to be written into the memory array and information to be simultaneously read out of the memory array without interference between the read and write functions.

BRIEF DESCRIPTION OF THE DRAWINGS

In the accompanying figures like reference characters denote like components.

DETAILED DESCRIPTION OF THE INVENTION

Figure 2:
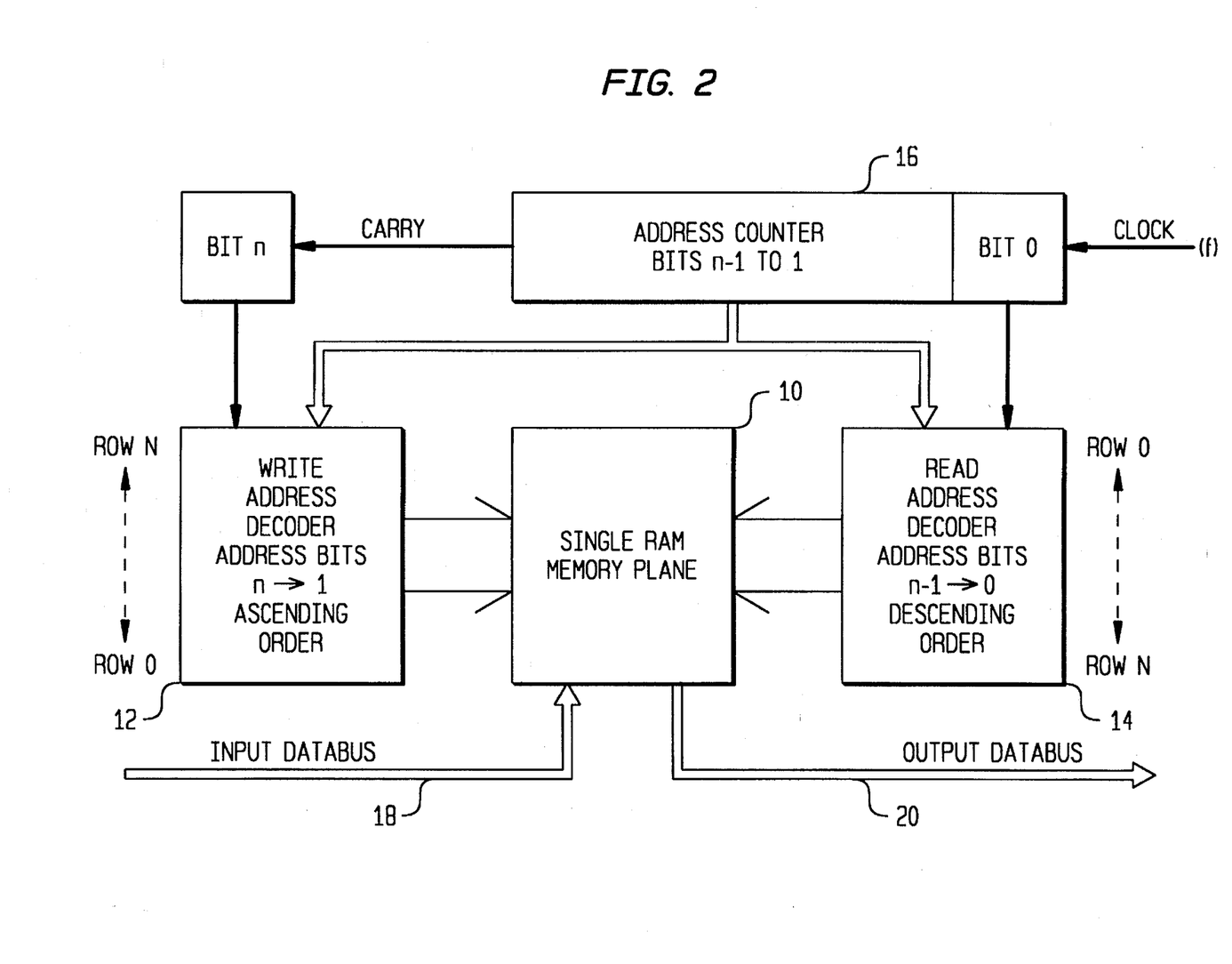
FIG. 2 is a block diagram of a memory system embodying the invention.

A memory system embodying the invention is shown in block form in FIG. 2. The memory system includes a large random access memory (RAM) array 10 whose rows of cells are accessed (scanned) by means of a write address decoder 12 and a read address decoder 14. In FIG. 2, a single address counter 16 responsive to a clock signal (f) is used to generate the signals applied to the write address decoder 12 and to the read address decoder 14. Thus, decoders 12 and 14 are operated from the same single address counter 16. Information to be stored in memory is supplied to RAM 10 via an input data bus 18 and information is read out of RAM 10 via output data bus 20.

In FIG. 2, address counter 16 is assumed to be n bits long (i.e., 0 through n bits). Bits 0 through n-1 are coupled to the read address decoder 14 and bits 1 through n are coupled to the write address decoder 12. Decoder 12 is designed to receive and decode bits 1 through n of address counter 16 and to produce a sequentially ordered series of pulses in an ascending sequence. Decoder 14 is designed to receive and decode bits 0 through n-1 of address counter 16 and to produce, in response thereto, a sequentially ordered series of pulses in a descending sequence. For purpose of illustration, in the description to follow, the write address decoding is arranged to scan the rows of memory in array 10 in ascending order while the read address decoding is arranged to scan the rows of memory in array 10 in descending order. However, it should be noted that the reverse operation could as well be done; that is, the write address decoding could be arranged to scan the rows of the memory in descending order and the read address decoding could be arranged to scan the rows of the memory in ascending order. The requirement of the design being that the read address decoder 12 and the write address decoder 14 access or scan the rows of the memory array in opposite directions, with one decoder scanning the memory array in descending order and the other decoder scanning the memory array in ascending order.

Figure 5:
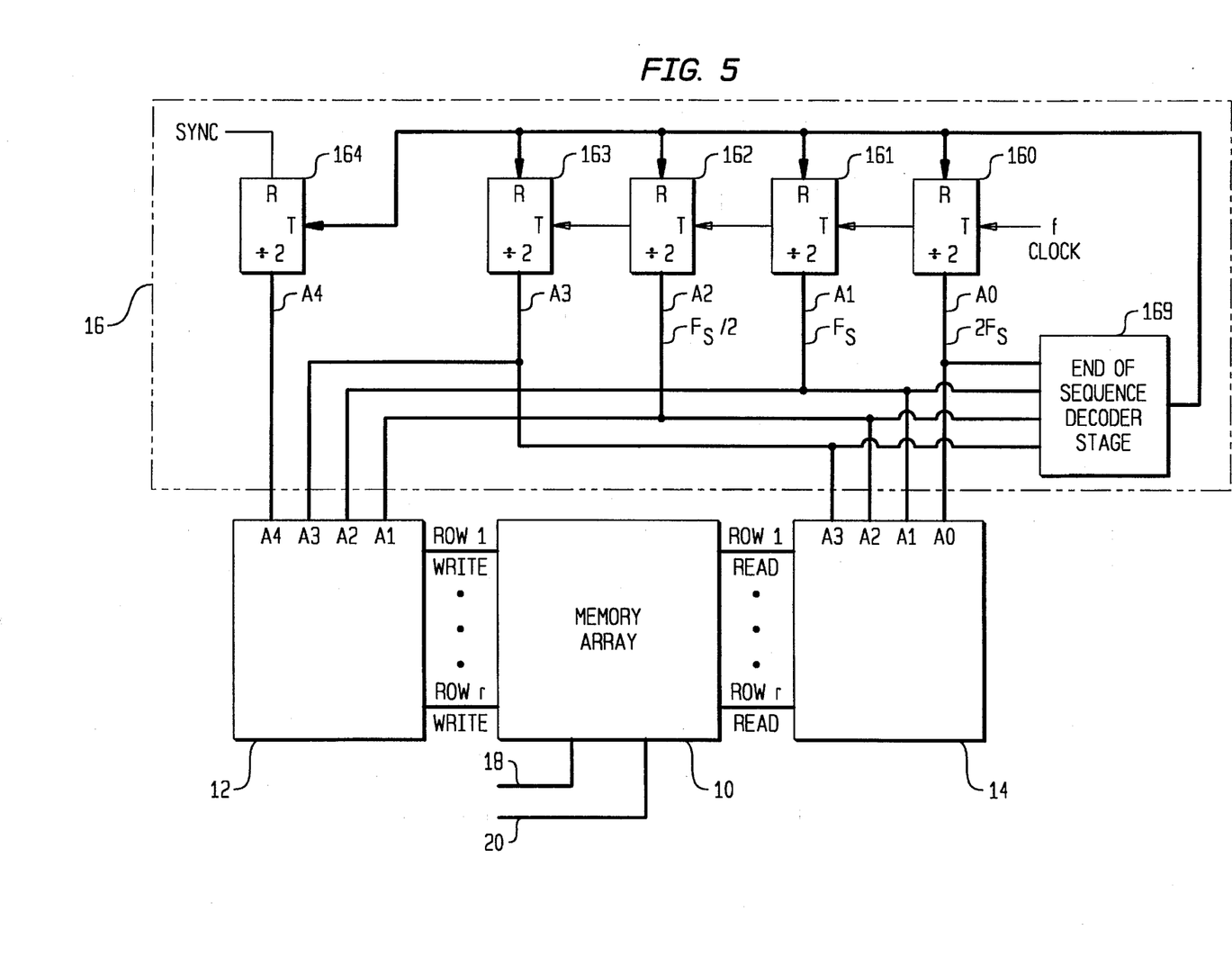
FIG. 5 is a block diagram of a counter circuit and address decoder circuitry which may be used to practice the invention.

In FIG. 2, the read decoder 14 scans the rows of the array 10 at twice the rate that the write decoder scans the rows of array 10 in order to have a read-out or read-back rate which is twice the write-rate. Hence the addressing rate of the write decoder 12 is half the rate of the read decoder 14. In one embodiment of the invention, the address counter, 16, as shown in FIG. 5, is a conventional binary counter which rolls over or is reset when the full number of addresses is reached. As shown in FIG. 5, the counter 16 includes 5 divide-by-two stages (160, 161, 162, 163, 164) responsive to an input clock signal (f) for producing outputs A0, A1, A2, A3 and A4. The outputs A0, A1, A2 and A3 are applied to read decoder 14, and the outputs A1, A2, A3 and A4 are applied to write decoder 12. In comparison to the read decoder 14, the write decoder 12 is essentially connected to the address counter 16 one bit shifted. This enables information to be written into memory array 10 at half the rate at which information is read out of the memory. In FIG. 5, the clock signal (f) is fed to the trigger input of the first stage, 160, and the output of each stage is coupled to the trigger input of the next succeeding stage. The outputs (A0, A1, A2, A3) of the first four stages (160, 161, 162, 163) are decoded by means of a decoding gate 169 and fed to the trigger input of the fifth stage (164). As shown in FIG. 5, at the end of each sequence the first four stages (160, 161, 162, 163) are reset and the fifth stage is toggled.

The structure and operation of the memory system of FIG. 2 is better explained with reference to the more detailed diagrams of FIGS. 3, 4A and 4B.

Figure 3:
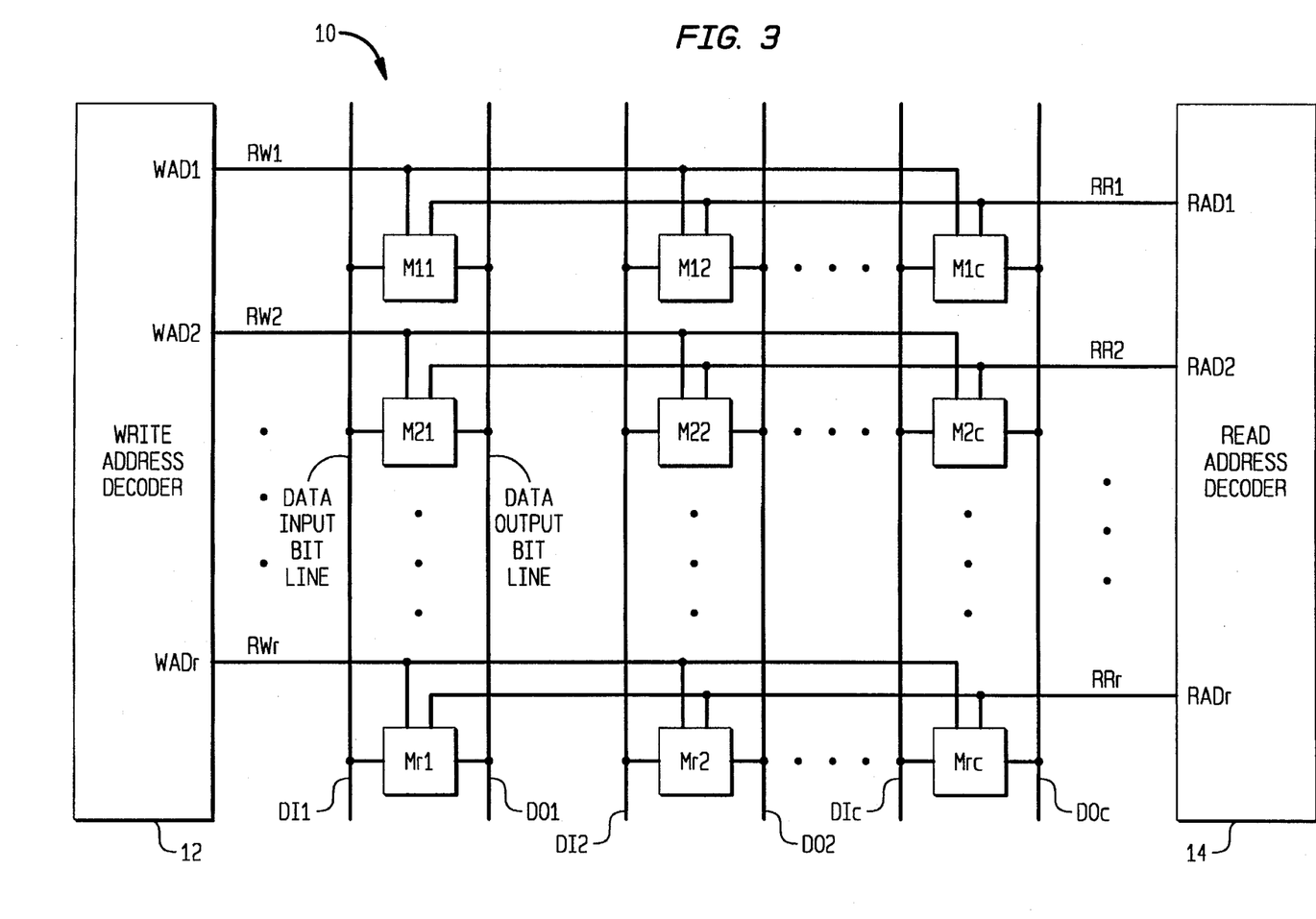
FIG. 3 is a diagram in block form of part of the memory array of FIG. 2 detailing the memory array.

FIG. 3 shows the organization of memory array 10 in accordance with the invention. The memory array 10 includes an array of memory cells, Mij; where "i" refers to the order of the rows and "j" refers to the order of the columns. The Mij cells are arranged in "r" rows and "c" columns; where "r" and "c" may be any integer, ranging from a few rows and columns to thousands of rows and columns, as in memory arrays presently being fabricated.

The memory cells Mij may be of the dynamic or static type. By way of illustration a three transistor dynamic memory cell 32 useable to form the memory array of FIG. 3 is shown schematically in FIG. 4A and in block form in FIG. 4B.

Figure 4A:
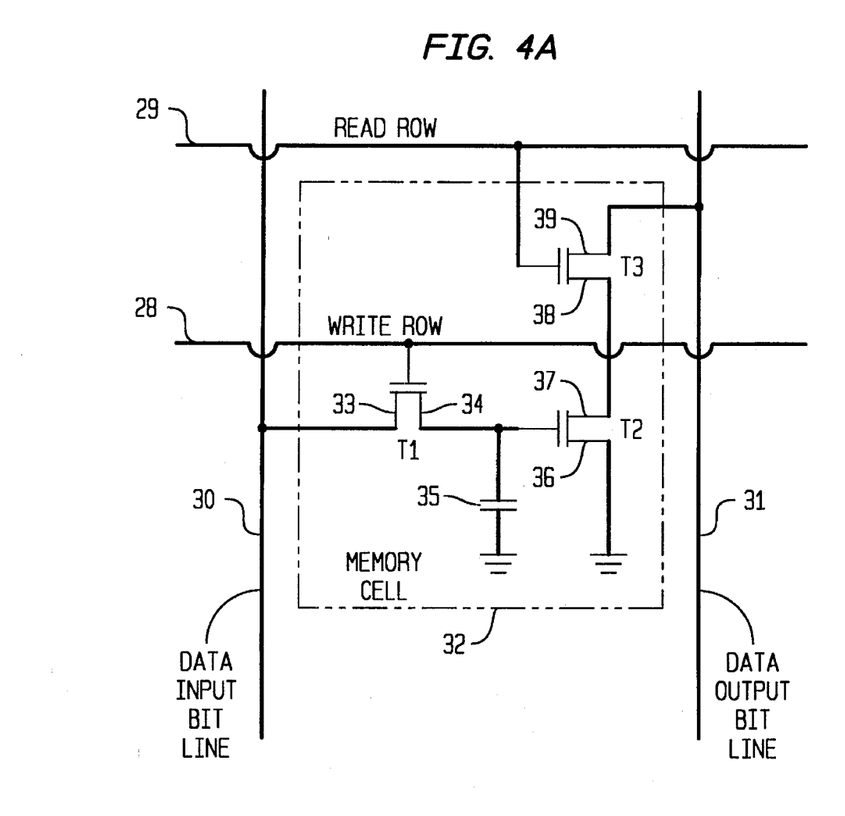
FIG. 4A is a schematic diagram of a dynamic memory cell which may be used to practice the invention.

Referring to FIG. 4A, there is shown transistors T1, T2, T3, which are interconnected to form a memory cell 32 and which are assumed to be insulated-gate field-effect transistors (IGFETs) of N-conductivity type. Each IGFET includes first and second regions (source and drain electrodes) defining the ends of a conduction path and a control electrode whose applied potential determines the conductivity of the conduction path. In an N-type IGFET, the source region (or source electrode) is defined as that one of the first and second regions having the less positive (lower) potential applied thereto. IGFETs are bi-directional conducting devices in the sense that when an enabling signal is applied to the control electrode, current can flow in either direction in the conduction path defined by the first and second regions, i.e., the source and drain electrodes (or regions) are interchangeable.

Referring to FIG. 4A, memory cell 32 is shown comprising a "write" or transmission gate transistor T1 connected at its gate to a write row conductor 28. One end (or electrode) 33 of the conduction path of T1 is connected to a data input bit line 30 and the other end (or electrode) 34 of its conduction path is connected to a data storage capacitor 35 and to the gate of a "storage" transistor T2. Transistor T2 has one end (source electrode) 36 of its conduction path connected to ground and the other end (drain electrode) 37 of its conduction path connected to one end (source electrode) 38 of the conduction path of a "selecting" transistor T3. T3 is connected at its gate electrode to a read row conductor 29 and the other end (drain electrode) 39 of its conduction path is connected to a data output bit line 31. Thus the conduction paths of T2 and T3 are connected in series between ground and data output bit line 31. For ease of description, capacitor 35 and the source of transistor T2 are shown connected to ground. However, it should be understood that a reference voltage other than ground could be employed.

The design of a memory cell with a data input bit line 30 separate from its data output bit line 31 and with separate write and read control lines 28 and 29, respectively, enables the memory array to be written into and read from, concurrently, without interference between the functions, as further described below.

The operation of the memory cell of FIG. 4A is briefly as follows, assuming T1, T2 and T3 to be N-channel IGFETs. When a "high" signal is applied to write row line 28 transistor T1 is turned-on and a "high" or "low" data bit on line 30 is written via the conduction path of a transistor T1 onto capacitor 35 where it is stored dynamically. That is, when a "high" (e.g., a voltage +V, positive with respect to ground) is present on data input bit line 30, and T1 is turned-on , conduction via the conduction path of T1 causes capacitor 35 to be charged towards the "high" value on line 30. When a "low" (e.g., a potential at, or close, to ground) is present on data input bit line 30, and T1 is turned-on, the conduction path of T1 causes capacitor 35 to be discharged to the "low" value on line 30. When a "low" signal is applied to write row line 28, transistor T1 is turned-off and it is non-conducting. The gate of T2 is then isolated from input line 30.

When a "high" signal is applied to read row line 29 transistor T3 is turned-on. If capacitor 35 is storing a "high", transistor T2 is also turned-on and the data output bit line 31 will be discharged via the series conduction paths of T2 and T3 to the "low" or ground potential applied to the source electrode 36 of T2. If capacitor 35 is storing a "low", transistor T2 remains turned-off and data output line 31 will remain charged to a "high" level; [This assumes that in the operation of the dynamic memory array the data output bit lines are precharged "high" before each read cycle.]

Figure 4B:
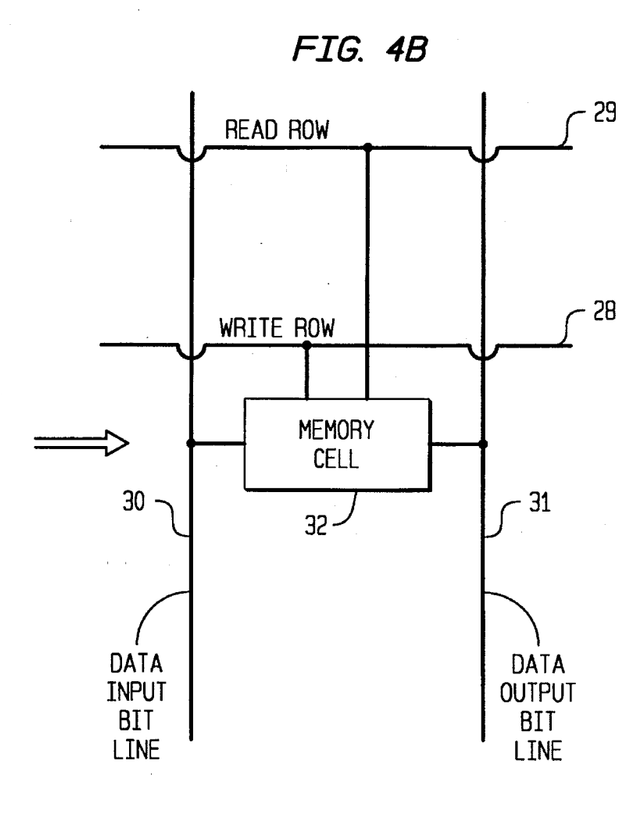
FIG. 4B is a block diagram representation of the circuit of FIG. 4A.

The memory cell shown schematically in FIG. 4A may be redrawn in block form as shown in FIG. 4B, with each memory cell 32 having a data input bit line 30, a data output bit line 31, a write line 28 and a read line 29, with the memory cell 32 functioning as described above. Thus, the memory cell 32 includes separate read, 29, and write, 28, conductors for accessing the memory cell 32 and separate data input, 30, and data output, 31, bit lines for, respectively, writing data in to the cell and reading the data contained in the cell. Since the implementation uses a three transistor DRAM cell with split input and output bit lines, there is no conflict in the input and output bit data paths.

Memory cells 32 of the type described in FIGS. 4A & 4B, corresponding to memory cells Mij of FIG. 3, may be interconnected to form a memory array 10 of "r" rows and "c" columns as shown in FIG. 3. As noted above, the number of rows in the array may range from a few rows to several thousand rows and the number of columns may likewise range from a few columns to several thousand columns, as is known in the art.

Referring to FIG. 3, the memory cells (Mij) of each row (i) of array 10 are connected to a row write conductor (RWi) which is driven by write address decoder 12 and to a row read conductor (RRi) which is driven by read address decoder 14. The memory cells (Mij) of each column (j) are connected to a data input bit line (DIj) and to a data output bit line (DOj).

In FIG. 3, write address decoder 12 has "r" unique outputs, one output for each row of the array, with each output (WADi) of the decoder 12 being connected to a specific and corresponding write row conductor (RWi). Likewise, read address decoder 14 has "r" unique outputs, one output for each row of memory array 10, with each output (RADi) of the decoder 14 being connected to a specific and corresponding read row line (RRi). The data input bit lines DIj may be multiplexed via circuitry (not shown) to a common master input data bus 18 (shown in FIG. 2) and the data output bit lines, DOj, may be multiplexed via circuitry (not shown) to a common master output data bus 20, shown in FIG. 2.

A significant aspect of the invention is that information can be written into the memory array 10 at a rate Fs and information can be simultaneously read out of the memory 10 at a rate of nFs without any interference between the read and write functions. This is achieved conditioned on the write and read decoders, 12 and 14, respectively, being programmed as follows:

(a) The write address decoder 12 is programmed to be sequenced at a rate Fs with each decoder output and hence each row being sequenced and energized (accessed) in a certain order (e.g., ascending order of 1 through r). Furthermore, where the order is in ascending order, after the rth row is written, the sequencing and accessing of the rows of the array 10 is repeated with the rows being energized in the same ordered sequence (1 through r) at a rate of Fs;

(b) The read address decoder 14 is programmed to be sequenced at a rate of nFs, with each decoder output and hence each row of the memory array being energized (accessed) or read in a reverse order to the order in which data is written into the memory. Where the memory is being written in ascending order, the memory is read in descending order. That is, the highest numbered row (r) is read out first, the lowest numbered row (i.e., 1) is read out last, with the rows being read at a rate of nFs;

(c) The outputs of the read and write decoders 12 and 14, respectively, are all synchronized or derived from the same clock signals in order to maintain a fixed relationship between the rates at which the rows of the array are written and read; and (d) the number of rows (r) of array 10 is a multiple of n+1; i.e., r= K(n+1); where n is the ratio of the rate (frequency or nFs) at which the read decoder is operated to the rate (frequency or Fs) at which the write decoder is operated; and K is an integer which may be selected by the user.

The structure of the memory array and the programming of the decoders 12 and 14, as discussed above, allows information to be written in sequence and in order into certain rows of the memory array and for information to be read out, in sequence and in order, from other rows of the memory array, without interference.

This will be now demonstrated for the condition where n is equal to 2 and the number of rows of the memory array 10 shown in FIGS. 2 and 3 is equal to 12; i.e., n=2, K=4 and r=12. For this condition, nFS is equal to 2 Fs, which means that read address decoder 14 is operated at the rate of 2 Fs and write address decoder 12 is operated at the rate of Fs. Thus, for each period T, where T is equal to 1/Fs, during which a row of the memory array is being written, there are two sub-periods (Ta and Tb) produced by, and corresponding to, 2 Fs during which two (different) rows of the memory array may be read.

The scanning and sequencing of memory array 10 discussed below may be better understood by reference to the Figures and Table 1, below. Assume that information is being written (at a rate of Fs) into row 1 of the memory array 10 during a first time period T1. During the first half (T1a) of time period T1, information is read (at a rate of 2 Fs) out of the 12th row and during the second half (T1b) of T1 information is read from the 11th row. During a subsequent second time period T2, information is written into row 2. During the first half (T2a) of period T2 information is read out from row 10 and during the second half (T2b) of period T2 information is read out of row 9. During a subsequent third time period T3, information is written into row 3. Concurrently, during the first half (T3a) of period T3 information is read out of row 8 and during the second half T3b of period T3 information is read out from row 7. During the subsequent fourth time period, T4, information is written into row 4. Concurrently, during the first half (T4a) of period T4 information is read out of row 6 and then during the second half (T4b) of period T4 information is read out of row 5. During the subsequent fifth time period, T5, information is written into row 5. Concurrently, during the first half (T5a) of period T5 information is read out of row 4 and during the second half (T5b) of period T5 information is read out of row 3.

It is significant to note that, by the appropriate choice of the number of rows (e.g., 12) and the sampling frequency (e.g., Fs and 2 Fs), when row 4 is being written rows 5 and 6 are being read and when row 5 is being written, rows 4 and 3 are read. Hence, the selection of the rows to be written has advanced forward and the selection of rows to be read has descended without interference. That is, at no time is there a condition during which information need be written into and need be read out from the same row at any one time. This is further demonstrated in TABLE 1 below which shows the read and write conditions for a full cycle. Note that the information read out from two adjacent rows, while information is written into one row, will be appropriately clocked or decoded, at a rate of 2 Fs, or higher, identifying its provenance.

TABLE 1

| Time period Rate Fs | Rows written at a rate of Fs in ascending order from lowest numbered row | Rate 2Fs | Rows read at a rate of 2Fs in descending order from highest numbered row |
|---|---|---|---|
| T1 | 1 | T1a | 12 |
|  |  | T1b | 11 |
| T2 | 2 | T2a | 10 |
|  |  | T2b | 9 |
| T3 | 3 | T3a | 8 |
|  |  | T3b | 7 |
| T4 | 4 | T4a | 6 |
|  |  | T4b | 5 |
| T5 | 5 | T5a | 4 |
|  |  | T5b | 3 |
| T6 | 6 | T6a | 2 |
|  |  | T6b | 1 |
| T7 | 7 | T7a | 12 |
|  |  | T7b | 11 |
| T8 | 8 | T8a | 10 |
|  |  | T8b | 9 |
| T9 | 9 | T9a | 8 |
|  |  | T9b | 7 |
| T10 | 10 | T10a | 6 |
|  |  | T10b | 5 |
| T11 | 11 | T11a | 4 |
|  |  | T11b | 3 |
| T12 | 12 | T12a | 2 |
|  |  | T12b | 1 |

As illustrated in Table 1, when the Write Decoder sequenced in ascending order is writing row 4, the Read Decoder sequenced in descending order is reading rows 5 and 6. At this point the Write and Read row decoders are at adjacent row locations. On the next cycle they "step over" each other and the Write and Read functions can continue without a row access conflict. That is the write decoder ascends and writes into row 5 while the read decoder descends and reads rows 4 and 3. This "stepping over" is functionally equivalent to switching into the next memory block, in the original separate memory implementation of the prior art, but requires no extra logic.

Features of the memory system, illustrated in the Figures and described above, may be summarized as follows:

(a) No memory location is written to and read from in the same cycle.

(b) When any one location is being written to, at least two uniquely defined and different locations are being read from, i.e. a fixed address pattern.

(c) Writing is at a frequency of Fs while reading is at a frequency of nFs.

(d) A dynamic random access memory (DRAM) may be used in memory systems embodying the invention because data is replaced in less than 100 microseconds. This is significant in that it permits operation without the need to refresh the memory contents. If refresh were required it would hamper the simple form of the structure shown in FIGS. 2 and 3. If longer delays than 100 microseconds are anticipated and slower operation of the memory is needed, so that refreshing of the memory cells is required, the memory array 10 would be preferably implemented using appropriate and known static random access memory (SRAM) arrays. In brief, since the retention time requirement is less than 100 microseconds, a DRAM with cells of the type shown in FIGS. 4A and 4B is the preferred memory structure. However, an SRAM could be used at some chip area expense.

(e) In the memory system shown in FIGS. 2 and 3, the use of two address decoders (12,14) driven from one address counter(16), one decoder for Read and one for Write, enables the memory array to be accessed in a continuously synchronous manner with the write function not interfering with the read function.

In the system of FIGS. 2 and 3, the entire memory array 10 is implemented in one memory plane. Upon closer inspection of the memory addressing requirements of the Memory, it is noted that the Write decoder scanning continuously increments upwards at frequency Fs and the Read decoder scanning sequences continuously through the memory, in the reverse order, at a rate of nFs. Where n is equal to 2 (i.e., nFs is equal to 2 Fs), the read decoder causes a read-out cycling backwards through the complete memory twice in the time taken for a forward pass of the Write addressing.

Where, as shown in FIG. 5, the Write addressing is absolutely linked to the Read addressing, the addressing function can be done with one address counter which is only required to count in one direction. One difference between the read and write function is that the read addressing is done in one direction and the write addressing is done in the opposite direction. In the system illustrated in FIG. 2, the order of the physical row addressing, ascending for the Write, descending for the Read, may be achieved by coding the corresponding row decoders in different ways. For example, the Write row corresponding to a zero from the address counter would be the lowest numbered row of the memory matrix, the Read row would be the highest numbered row; etc. In this way the selected rows approach each other from opposite ends of the memory producing the write-forward, read-backwards effect from one counter.

In FIG. 2, the other difference between the Write and Read functions is the frequency, Write at Fs and Read at 2 Fs. Since the frequencies are locked at 2:1, this can also be achieved with one counter by selecting the appropriate bits of the counter to drive the decoders. The Write decoder is driven by bits 1-to-n while the Read decoder is driven by bits 0-to-(n−1), assuming a 0 to n bit counter. In this way a read frequency which is double the write frequency is automatically obtained.

As shown in FIG. 2, bits A(0) through A(n−1) of counter 16 are supplied to Read Row Decoder 14, and bits A(1)

through A(n) of counter 16 are supplied to Write Row Decoder 12. For the structure shown in FIG. 5, the read address is incremented on each clock pulse (f) whereas the write address only changes every second pulse. The read sequence is therefore cycling at twice the rate of the write sequence. Furthermore, the physical row being addressed is also reversed by the read and write row decoder as shown in Table 2, below.

Table 2 is an example which corresponds to a memory length of 12 rows using 5 bits of counter arranged, for example, as shown in FIG. 5. The lower bits have a reset to zero at a code of 12 with a carry into the fifth bit. Note: at no time are the same rows addressed by the read and write decoders.

TABLE 2

| Cycle | Counter Bits | | | | | Decoder Sequences | |
|---|---|---|---|---|---|---|---|
| | | | | | | Read Row Bits | Write Row Bits |
| Count | A4 | A3 | A2 | A1 | A0 | A0–A3 | A1–A4 |
| 0 | 0 | 0 | 0 | 0 | 0 | 12 | 1 |
| 1 | 0 | 0 | 0 | 0 | 1 | 11 | 1 |
| 2 | 0 | 0 | 0 | 1 | 0 | 10 | 2 |
| 3 | 0 | 0 | 0 | 1 | 1 | 9 | 2 |
| 4 | 0 | 0 | 1 | 0 | 0 | 8 | 3 |
| 5 | 0 | 0 | 1 | 0 | 1 | 7 | 3 |
| 6 | 0 | 0 | 1 | 1 | 0 | 6 | 4 |
| 7 | 0 | 0 | 1 | 1 | 1 | 5 | 4 |
| 8 | 0 | 1 | 0 | 0 | 0 | 4 | 5 |
| 9 | 0 | 1 | 0 | 0 | 1 | 3 | 5 |
| 10 | 0 | 1 | 0 | 1 | 0 | 2 | 6 |
| 11 | 0 | 1 | 0 | 1 | 1 | 1 | 6 |
| 12 | 1 | 0 | 0 | 0 | 0 | 12 | 7 |
| 13 | 1 | 0 | 0 | 0 | 1 | 11 | 7 |
| 14 | 1 | 0 | 0 | 1 | 0 | 10 | 8 |
| 15 | 1 | 0 | 0 | 1 | 1 | 9 | 8 |
| 16 | 1 | 0 | 1 | 0 | 0 | 8 | 9 |
| 17 | 1 | 0 | 1 | 0 | 1 | 7 | 9 |
| 18 | 1 | 0 | 1 | 1 | 0 | 6 | 10 |
| 19 | 1 | 0 | 1 | 1 | 1 | 5 | 10 |
| 20 | 1 | 1 | 0 | 0 | 0 | 4 | 11 |
| 21 | 1 | 1 | 0 | 0 | 1 | 3 | 11 |
| 22 | 1 | 1 | 0 | 1 | 0 | 2 | 12 |
| 23 | 1 | 1 | 0 | 1 | 1 | 1 | 12 |

Figure 6:
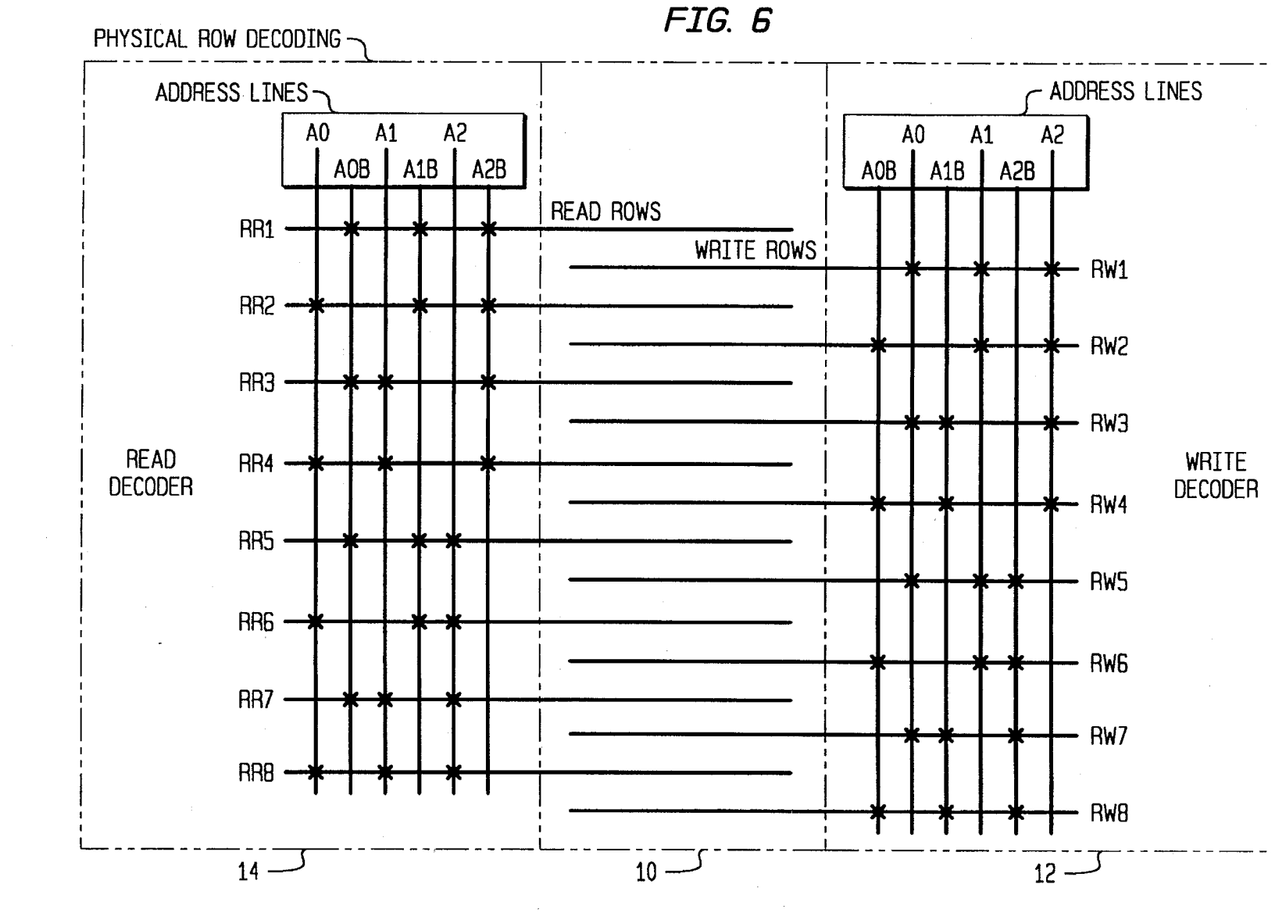
FIG. 6 is a diagram illustrating a decoding arrangement which may be used to practice the invention.

FIG. 6 illustrates a form of write and read decoders where three address bits are to be decoded. In FIG. 6, the cross between a vertical address line and a horizontal row line indicates the presence of a transistor. The three transistors on any one row form a 'NOR' function producing a logical 1 on the row if all three address lines are at 0's. This is the simplest way to describe the operation of the decoders although not exactly as it appears on the silicon. The actual implementation is a precharged dynamic decoder for minimum silicon area using dynamic NAND and INVERT gates for the same logical results.

The A(n)'s are the true Address Counter Bits while the A(n)B's are the inverted forms of the corresponding bits. For example, if the counter is at 0, i.e. A0, A1, and A2 all equal to logical 0, A1B, A2B, and A3B all equal to 1, then the bottom row in the Read Decoder would be the only read row high and the top row in the Write Decoder would be the only write row high. This shows how the write and read addressing select physically different cells.

In the system of FIG. 2 as implemented by the counter of FIG. 5, during each period that a row is written, two rows are read, or in other words, three rows (locations) are accessed.

Therefore the total row count must be a multiple of 3. In a particular implementation, 40 words were stored and at the same time 80 other words were read back giving a total memory length of 120, a multiple of three.

When and where it is desired to "trace back" further upon each block completion, i.e., it is desired to read-out more than twice the amount of new data written into the memory, ratios other than two may be implemented. For example, for each write row, four rows could be read or "traced-back" for a total of five access per cycle. This would require a memory whose length is a multiple of five. Continuing this example the write block size could still be 40, the read back would be 160 for a total length of 200, a multiple of five. In this case the read decoder would be designed to run four times faster than the write decoder. This could be achieved by connecting the write decoder to bits A(2) to A(n) of the address counter and the read decoder to bits A(0) to A(n–2) of the address counter.

Figure 7:
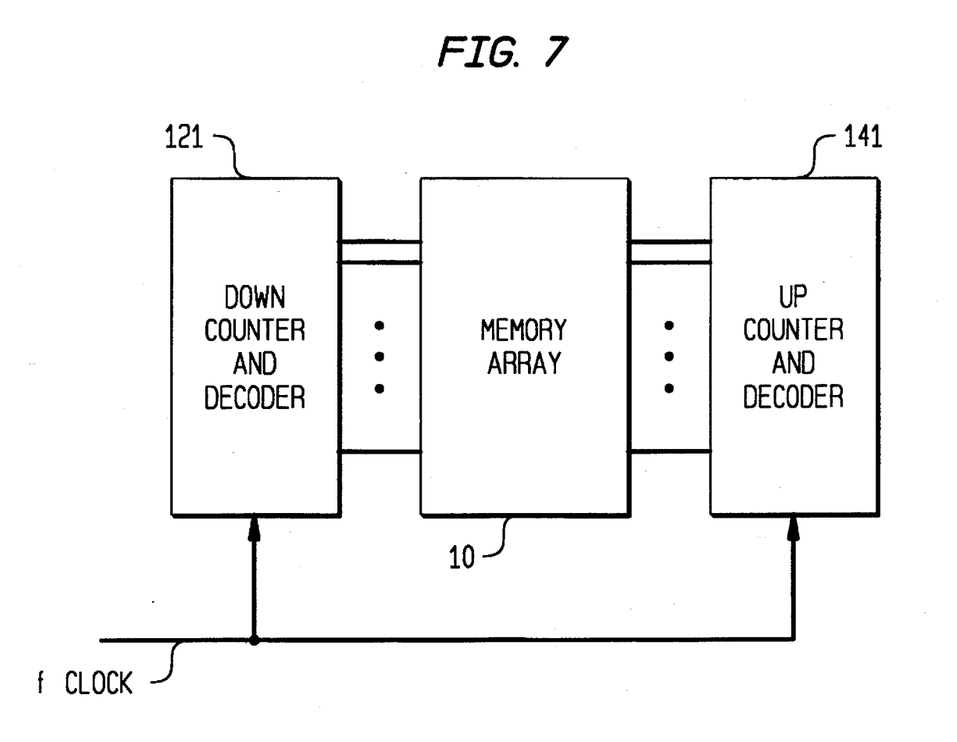
FIG. 7 is another block diagram of counting and decoding circuitry which may be used to practice the invention.

For the use of a single address counter the ratio of the read speed to the write speed must be a binary number i.e. 2,4, 8 etc. In this way moving the decoder taps on the counter is all that is required. It should be appreciated that non binary ratios can be implemented with the decoder scheme, however two separate counters would be required. This could also be achieved by an up-counter 141 and a down-counter 121 preferably driven by the same clock (f) as shown in FIG. 7.

It has therefore been shown that the use of a contiguous memory plane, with one address counter and two separate and uniquely programmed row decoders permit a memory system to be implemented with substantially less silicon area, hence cost, when compared to traditional methods of fabrication.

What is claimed is:

1. A combination comprising:

a memory array of cells arranged in "r" rows and "c" columns each row of cells connected to a write row line for controlling the writing of information into the cells of the row and a read row line for controlling the reading of information stored in the cells of the row;

a write address decoder having "r" write address outputs, one write address output corresponding to each write row line of the memory array and being connected thereto;

a read address decoder having "r" read address outputs, one read address output corresponding to each read row line of the memory array and being connected thereto;

means coupled to the write address decoder and to the read address decoder for generating signals at the outputs of the write and read address decoders for energizing the outputs of the write address decoder and its corresponding write row lines in an ascending sequence from 1 to r, at a rate of Fs and for generating signals energizing the outputs of the read address decoder and its corresponding read row lines in a descending order from the rth row to the first row at a rate of nFs; where n is an integer, and Fs is a selected frequency.

2. A combination as claimed in claim 1 wherein each column of memory cells is connected to a data input bit line and to a separate data output bit line.

3. A combination as claimed in claim 2 wherein the number of rows ("r") of the memory array is equal to k(n+1); where k is any integer equal to or greater than one; and where n is an integer equal to the ratio of nFs/Fs.

4. A combination as claimed in claim 3 wherein the means coupled to the write address decoder and to the read address decoder for generating signals includes a single counter which supplies clocking signals to the write address decoder and to the read address decoder.

5. A combination comprising a memory array of cells arranged in "r" rows and "c" columns, each row of cells connected to a write row line and a read row line; where "r" and "c" are integers greater than 2;

a write address decoder having "r" write address outputs, one write address output corresponding to each write row line of the memory array and being connected thereto;

a read address decoder having "r" read address outputs, one read address output corresponding to each read row line of the memory array and being connected thereto;

means coupled to the write address decoder and to the read address decoder for generating signals at the outputs of the write and read address decoders for energizing the outputs of the write address decoder and its corresponding write row lines, sequentially, in a first direction at a rate of Fs and for generating signals energizing the outputs of the read address decoder and its corresponding read row lines, sequentially, in a second direction, opposite to said first direction, at a rate of nFs; where n is an integer.

6. A combination as claimed in claim 5, wherein said first direction is in an ascending order from row 1 to row r; and wherein said second direction is in descending order from the rth row to the first row.

7. A combination as claimed in claim 6 wherein each column of memory cells is connected to a data input bit line and to a separate data output bit line.

8. A combination as claimed in claim 7 wherein the number of rows of the memory array is equal to k(n+1); where k is any integer equal to or greater than one; and wherein n is an integer equal to the ratio of nFs/Fs.

9. A combination as claimed in claim 8 wherein said means coupled to the write and read address decoders includes an address counter and means for supplying a clock signal to said address counter and wherein said address counter supplies clocking signals to the write address decoder and to the read address decoder.

10. A combination comprising a memory array of cells arranged in "r" rows and "c" columns, each row of cells being connected to a write row line and to a separate read row line; where "r" and "c" are integers greater than 2;

a write address decoder having "r" write address outputs, one write address output corresponding to each write row line of the memory array and being connected thereto;

a read address decoder having "r" read address outputs, one read address output corresponding to each read row line of the memory array and being connected thereto;

means coupled to the write address decoder and to the read address decoder for generating signals at the outputs of the write and read address decoders for accessing the outputs of the write address decoder and its corresponding write row lines, sequentially, in a first direction at a rate of Fs and for generating signals accessing the outputs of the read address decoder and its corresponding read row lines, sequentially, in a second direction, opposite to said first direction, at a rate of nFs; where n is an integer equal to, or greater than, 2.

11. A combination as claimed in claim 10, wherein said first direction is in an ascending order from row 1 to row r; and wherein said second direction is in descending order from the rth row to the first row.

* * * * *